(12) United States Patent
Sato (10) Patent No.: US 7,372,146 B2
(45) Date of Patent: *May 13, 2008

(54) SEMICONDUCTOR MODULE

(75) Inventor: Nobuyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

This patent is subject to a terminal disclaimer.

(21) Appl. No.: 11/299,812

(22) Filed: Dec. 13, 2005

(65) Prior Publication Data

US 2006/0097380 A1     May 11, 2006

Related U.S. Application Data

(63) Continuation of application No. 10/814,290, filed on Apr. 1, 2004, now Pat. No. 7,071,550.

(30) Foreign Application Priority Data

Feb. 3, 2004     (JP)     .............................. 2004-027066

(51) Int. Cl.
*H01L 23/10* (2006.01)

(52) U.S. Cl. ...................... 257/706; 257/675; 257/707; 257/796; 257/E23.101; 257/E23.103; 257/E23.105

(58) Field of Classification Search ................ 257/706, 257/675, 707, 796, E23.101, E23.103, E23.105
See application file for complete search history.

(56) References Cited

U.S. PATENT DOCUMENTS 5,057,909 A * 10/1991 Mok et al. .................. 257/722
5,291,064 A * 3/1994 Kurokawa .................. 257/714
5,396,403 A    3/1995 Patel
5,471,366 A   11/1995 Ozawa
5,552,635 A * 9/1996 Kim et al. .................. 257/706
5,604,978 A    2/1997 Sherif et al.
6,069,793 A    5/2000 Maruyama et al.
6,236,568 B1   5/2001 Lai et al.
6,259,156 B1   7/2001 Kohno et al.
6,291,880 B1   9/2001 Ogawa et al.
6,292,369 B1   9/2001 Daves et al.
6,433,412 B2   8/2002 Ando et al.
6,534,859 B1   3/2003 Shim et al.

(Continued)

FOREIGN PATENT DOCUMENTS

JP        11-45976       2/1999

(Continued)

*Primary Examiner*—Andy Huynh
(74) *Attorney, Agent, or Firm*—Oblon, Spivak, McClelland, Maier & Neustadt, P.C.

(57) ABSTRACT

A semiconductor module includes a parts-mounting or packaging substrate, a plurality of power metal insulator semiconductor (MIS) chips which have top surfaces and back surfaces and are mounted by flip chip bonding on or above the package substrate while letting the top surfaces face the package substrate, a drive-use integrated circuit (IC) chip which is mounted by flip chip bonding above the package substrate for driving the gates of metal insulator semiconductor field effect transistors (MISFETs) that are formed on the power MIS chips a plurality of heat sinks disposed on or above the back surfaces of the power MIS chips, and a resin member for sealing the power MIS chips and the driver IC chip together in a single package.

9 Claims, 6 Drawing Sheets

U.S. PATENT DOCUMENTS

| | | |
|---|---|---|
| 6,580,125 B2 | 6/2003 | Kitabatake et al. |
| 6,707,671 B2 | 3/2004 | Yamashita et al. |
| 6,756,689 B2 | 6/2004 | Nam et al. |
| 6,775,141 B2 | 8/2004 | Yoshida et al. |
| 6,806,548 B2 | 10/2004 | Shirai et al. |
| 6,867,494 B2 | 3/2005 | Kameda et al. |
| 6,917,103 B2 * | 7/2005 | Hirano et al. ............... 257/707 |
| 7,071,550 B2 * | 7/2006 | Sato .......................... 257/706 |

FOREIGN PATENT DOCUMENTS

JP    2001-291823    10/2001

* cited by examiner

SEMICONDUCTOR MODULE

CROSS-REFERENCE TO RELATED APPLICATIONS

This application is based upon and claims the benefit of priority from the prior Japanese Patent Application No. 2004-027066, filed on Feb. 3, 2004, and is a continuation of U.S. patent application Ser. No. 10/814,290, filed Apr. 1, 2004, which is now issued as U.S. Pat. No. 7,070,550 and the entire contents each of which are incorporated herein by reference.

BACKGROUND OF THE INVENTION

1. Field of the Invention

The present invention relates to semiconductor modules such as multi-chip modules, for example.

2. Description of the Related Art

DC-to-DC converters are the devices that convert a DC current at one voltage into a DC current with a different voltage level. As DC-DC converters are of high efficiency and are designable to have small sizes, these are adaptable for use as power supply units to be built in various types of small-size electronic equipment (for example, information communication equipment such as notebook personal computers or "PCs" and handheld wireless telephone handsets, also known as mobile phones).

Information communication equipment such as PCs or the like is such that the power supply unit (driving power supply) is becoming lower in voltage and larger in current with advances in miniaturization and high-speed performance of central processing units (CPUs). Although in 1995 the CPU-use power supply voltage remains at the level of 5.0 volts (V) or 3.3V in most applications, the supply voltage is recently lowered to 1.5V due to the appearance of a high-performance CPU with its clock frequency of more than 1 gigahertz (GHz). This trend also requires the current to stay in a class of 100 amperes (A). In addition, in order to offer the supportability of CPU operating speeds, the operation frequency of a power supply circuit also is required to be set at 1 megahertz (MHz) or greater. Due to this, it also becomes important to speed up the switching operations of transistors making up the power supply circuit.

The quest for lower voltages and larger currents of power supply units results in a change in the form of prior known power supply systems. A form having a single power supply unit for supplying electrical power to a plurality of circuits is such that a voltage drop-down can occur even due to the presence of tiny parasitic impedance of wiring lines. This voltage drop might lead to a failure in supplying a required voltage to circuitry, which in turn causes operation errors or malfunctions. To avoid this risk, the decentralization of power supply has advanced at present, for making the transition to a form which employs power supply units corresponding to respective loads and dispose them adjacent to the loads.

Explaining this context while taking a notebook PC as an example, the notebook PC is typically designed to include some major loads such as a CPU, a liquid crystal display (LCD) panel, a hard disk module and others. Separate power supply units (that is, DC-DC converters) corresponding to respective loads are disposed near the loads.

Currently available DC-DC converters for large power use include a noninsulated voltage-drop or "step-down" converter of the type using synchronous rectification schemes. This converter is generally made up of a power metal oxide semiconductor field effect transistor (power MOSFET) of the N-channel type, a Schottky barrier diode (SBD), and an integrated circuit (IC) for pulse width modulation (PWM) control. The individual one of these components is packaged in a way independent of the others. These packaged parts are attached to and mounted on a printed wiring board.

In most cases, a power device such as the power MOSFET used in power supply circuitry experiences heatup, which is caused by power losses due to turn-on resistance and switching operations. To avoid this, it is required that a heat removing device, called the heat sink, is attached to a chip of the power MOSFET for forcing the heat to escape toward the outside of the chip. Note here that a high-frequency multi-chip module is disclosed in FIG. 1 of Published Japanese Patent Application JP-A-11-45976, which module is structured so that a heat sink is attached to a semiconductor chip.

BRIEF SUMMARY OF THE INVENTION

In accordance with one aspect of the present invention, a semiconductor module comprises a parts-mounting or packaging substrate, a plurality of power switching device chips having top surfaces and back surfaces and being mounted by flip chip bonding above the package substrate while letting the top surfaces face the package substrate, a drive-use integrated circuit ("IC") chip mounted by flip chip bonding above the package substrate, configured to drive gates of transistors formed in the plurality of power switching device chips, a plurality of heat sinks disposed above the back surfaces of the plurality of power switching device chips, and a resin member configured to seal the plurality of power switching device chips and the drive-use IC chip as a single package.

In accordance with another aspect of this invention, a semiconductor module comprises a package substrate, a power switching device chip having a top surface and a back surface and being mounted by flip chip bonding at the package substrate while letting the top surface face the package substrate, a driver IC chip mounted by flip chip bonding at the package substrate configured to drive a gate of a transistor formed in the power switching device chip, a heat sink being disposed above the back surface of the power switching device chip and extending to overlie the driver IC chip and a sealing member configured to seal the power switching device chip and the driver IC chip together as a one package.

In accordance with a further another aspect of the invention, a semiconductor module comprises a package substrate, a power switching device chip having a top surface and a back surface and being mounted by flip chip bonding at the package substrate while letting the top surface face the package substrate, a driver IC chip mounted by flip chip bonding at the package substrate, configured to drive a gate of a transistor formed in the power switching device chip, a heat sink disposed above the back surface of the power switching device chip and electrically connected to the back surface and terminals of the package substrate and a resin member configured to seal the power switching device chip and the driver IC chip together as a one package.

DETAILED DESCRIPTION OF THE EMBODIMENT

Embodiments of the present invention will be explained with reference to the accompanying drawings below. In the drawings for explanation of each embodiment, the same reference numerals are added to parts or components that are the same as those indicated by reference numerals in previous drawings, and explanations thereof will be omitted. Semiconductor modules in accordance with these embodiments are multiple-chip modules with power MOS chips and a drive-use IC chip sealed together in a single package. Each module functions as part of a DC-to-DC converter.

It is noted that although a power MOS chip is configured from more than one FET having its gate insulation film including a silicon oxide film, the present invention should not be limited thereto and may also be applicable to a power metal insulator semiconductor (MIS) chip, which is made up of FETs and IGBTs each having a gate insulator film formed of a dielectric film other than the silicon oxide films—for example, a high-dielectric-constant film. Also note that the semiconductor module in accordance with this embodiment below is for use as a DC-DC converter. However, this invention is not limited thereto and may alternatively be used for other types of electronic equipment including, but not limited to, digital equipment such as for example an audio or audiovisual apparatus or equivalents thereto.

First Embodiment

Figure 1:
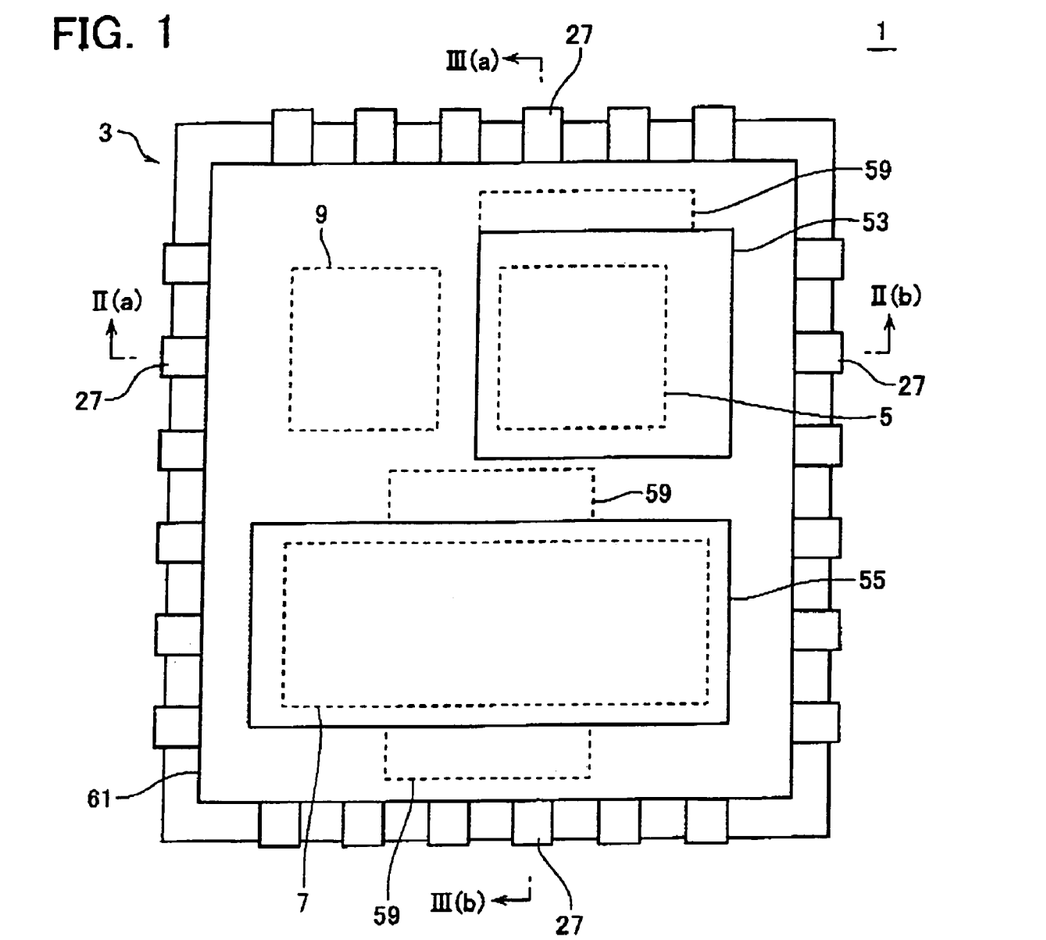
FIG. 1 is a diagram showing a plan view of a semiconductor module in accordance with a first embodiment of the invention.
Figure 2:
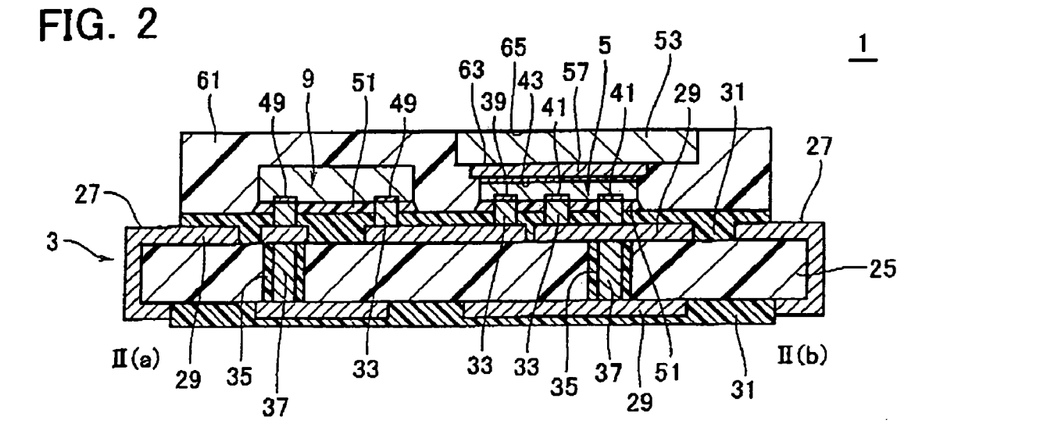
FIG. 2 is a diagram showing a cross-sectional view of the module of FIG. 1 as taken along line II(a)-II(b).

The structure of a semiconductor module in accordance with a first embodiment of the invention will be explained with reference to FIGS. 1 to 3. FIG. 1 is a plan view of the semiconductor module in accordance with the first embodiment. FIG. 2 is a cross-sectional diagram of the module as taken along line II(a)-II(b) of FIG. 1, whereas FIG. 3 is a sectional view taken along line III(a)-III(b) of FIG. 1.

The semiconductor module 1 has a parts-mounting or packaging substrate (for example, printed wiring board) 3 and IC chips mounted thereon, wherein the chips include two power MOS chips 5 and 7 and an IC chip 9 for drive use. The driver IC chip 9 is for driving the gates of MOSFETs formed on the power MOS chips 5 and 7.

Figure 4:
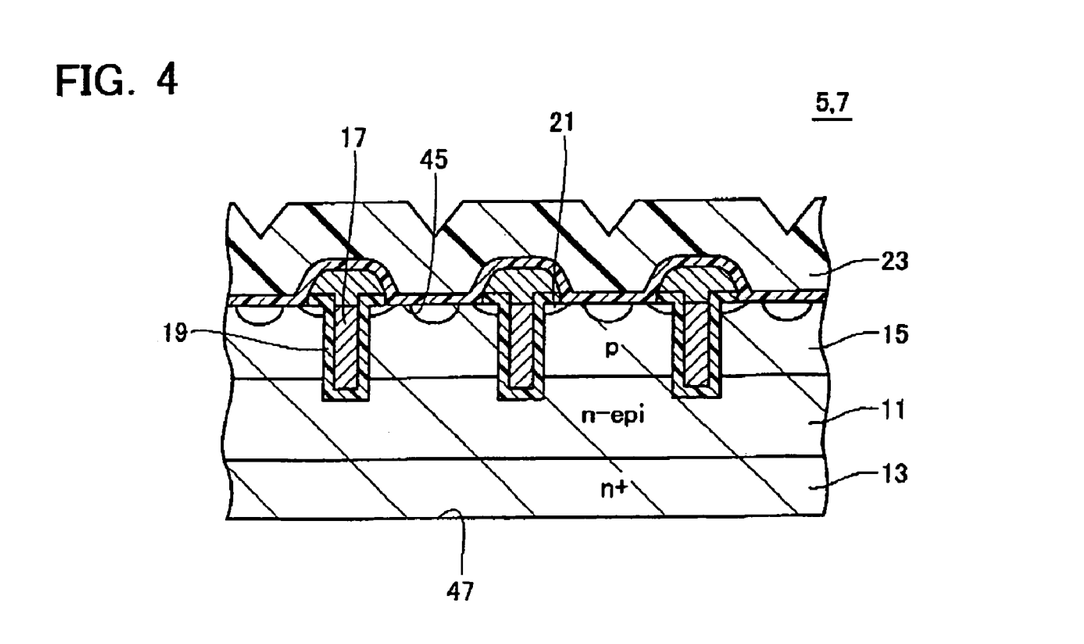
FIG. 4 is a sectional diagram of part of a power MOS chip used in the first embodiment.

FIG. 4 shows a sectional view of part of the power MOS chip 5, 7. The chip 5, 7 is structured so that a great number of vertical type MOSFETs are connected in parallel with one another. Explaining in more detail, the chip 5, 7 has a heavily-doped n (n$^+$) type silicon substrate 13 with an epitaxial layer 11 of n conductivity type. An upper layer of the n-type epitaxial layer 11 is a body region 15 of the p conductivity type. A large number of trench gates 17 are formed in the epitaxial layer 11 so that they penetrate the body region 15. A gate oxide film 19 is formed around the trench gates 17. The body region 15 has its top surface, in which n$^+$-type source regions 21 are formed. A passivation film 23 is formed to cover the trench gates 17 and source regions 21. The silicon substrate 13 becomes n$^+$-type drain regions.

Figure 3:
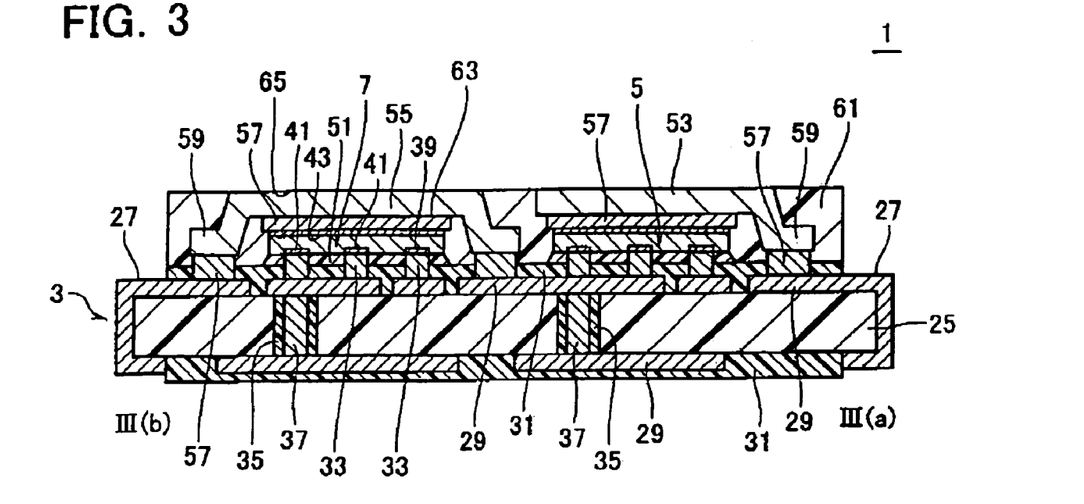
FIG. 3 is a cross-sectional diagram of the module of FIG. 1 as taken along line III(a)-III(b).

As shown in FIGS. 1-3, the package substrate 3 has a rectangular resin plate 25. This resin plate 25 has its side edges whereat multiple connection terminals 27 are provided. These terminals 27 extend from a one surface of the resin plate 25 through side faces to the other surface. Wiring lines 29 are formed on the both surfaces of the resin plate 25 so that these are connected to the terminals 27. The terminals 27 and wiring lines 29 are made of electrical conductive material, such as a copper foil or the like.

On the both surfaces of the resin plate 25, a dielectric film (e.g. solder resist) 31 is formed to cover the wiring lines 29. The dielectric film 31 covers none of the terminals 27 and has openings at locations overlying portions of the wiring lines 29 to be connected to the chips 5, 7 and 9. In these openings, a conductive paste material 33, such as soldering material, is formed by screen printing techniques.

A number of through-going holes are formed in the resin plate 25. Each through-hole has its inner side face, on which a dielectric film 35 such as a silicon oxide film or else is formed. The individual through-hole is filled with a buried conductive film 37 made of copper or else. The presence of the buried conductive film 37 permits the wiring lines 29 on the both surfaces of resin plate 25 to be electrically connected together.

The power MOS chips 5 and 7 and the driver IC chip 9 are mounted by flip chip bonding techniques on the package substrate 3. More specifically, the power MOS chip 5, 7 has a top surface on which gate electrodes 39 and source electrodes 41 are formed and also has a back or bottom surface on which drain electrodes 43 are formed. The gate electrodes 39 are common-connected to the multiple trench gates 17 shown in FIG. 4 on the top surface 45 side of power MOS chip 5, 7. The source electrodes 41 are common-coupled to the multiple source regions 21 shown in FIG. 4 on the top surface 45 side of power MOS chip 5, 7. The drain electrodes 43 are connected to the silicon substrate (drain regions) 13 shown in FIG. 4 on the back surface 47 side of power MOS chip 5, 7.

The gate electrodes 39 and source electrodes 41 of the power MOS chip 5, 7 along with electrodes 49 of the driver IC chip 9 are soldered by the conductive paste material 33 to the package substrate 3. The chip 5, 7, 9 and the mount substrate 3 define a gap space therebetween, which is filled with an under-fill material 51.

On the back surface 47 (FIG. 4) of the power MOS chip 5, a heat sink 53 is disposed to cover the power MOS chip 5. Similarly, a heat sink 55 is laid out on the back surface 47 (FIG. 4) of the power MOS chip 7 to cover this power MOS chip 7. The heat sinks 53 and 55 are soldered by conductive paste material 57 to the drain electrodes 43 on the back surfaces of power MOS chips 5 and 7, respectively. Thus, each heat sink is electrically connected to the drain electrodes on the back surface of a corresponding one of the power MOS chips (alternatively, the source electrodes in case these are present on the back surface side of the chip).

The heat sink 53, 55 is made of a metallic material, such as copper or aluminum or the like. The heat sink 53, 55 has a metal frame shape, with its side portion becoming a bend or fold part 59. This fold part 59 is soldered by conductive paste material 57 to the package substrate 3. Thus the heat sink 53, 55 is electrically connected to the terminals 27 of the mount substrate 3.

A resin member 61 is immovably secured onto the mount substrate 3, for sealing the power MOS chip 5, 7 and the driver IC chip 9 together as a single package. Each heat sink 53, 55 has a one surface 63 which faces the back surface of its corresponding power MOS chip 5, 7 and also has the other surface 65 on the opposite side thereto. The other surface 65 is exposed to outside of the semiconductor module 1.

Figure 5:
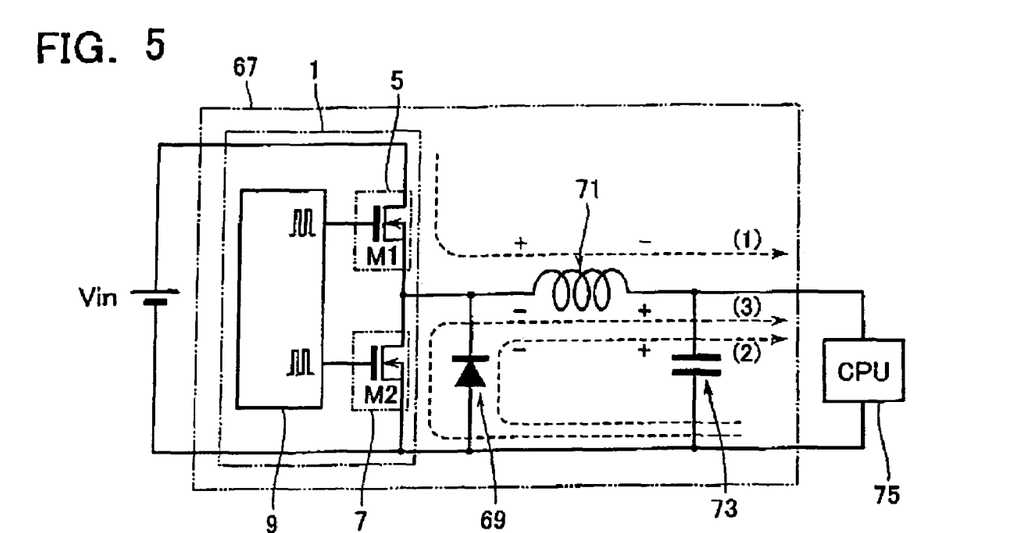
FIG. 5 is a circuit chart of a DC-DC converter in accordance with the first embodiment.

An explanation will next be given of a circuit configuration and operation of a DC-to-DC converter which includes the semiconductor module 1. FIG. 5 is a circuit diagram of this DC-DC converter 67. The DC-DC converter 67 is of the noninsulated step-down type using synchronous rectification schemes. Using this type of circuitry makes it possible to minimize the power loss while at the same time enhancing the conversion efficiency.

Both the power MOS chip (control-side device) 5 and the power MOS chip (synchronous rectification-side device) 7 are designed to use N-channel MOSFETs, which are low in turn-on resistance and low in gate capacitance. The power MOS chip (synchronous rectification-side device) 7 is such that a Schottky barrier diode (SBD) 69, which is low in forward voltage (VF) value, is connected in parallel. The driver IC chip 9 for gate drive use is connected to gate terminals of the power MOS chips 5 and 7.

In ordinary or "normal" operation modes, the gates of the chips 5 and 9 are driven under the PWM control. The PWM control refers to a control scheme for stabilization of a DC output voltage of a switching power supply unit. In short, the output voltage is controlled while letting a switching transistor (i.e. power MOS chip 5) change or vary in ratio of turn-on (ON) time to turn-off (OFF) time. When the output voltage decrease in potential, let the ON time become longer; when the voltage increases, let it be shorter. Whereby, it is possible to retain a fixed potential level of voltage at all times.

An inductor 71 and a capacitor 73 are connected to the output side of the DC-DC converter 67. A load—here, CPU 75 for example—is connected to an output of DC-DC converter 67.

Figure 6:
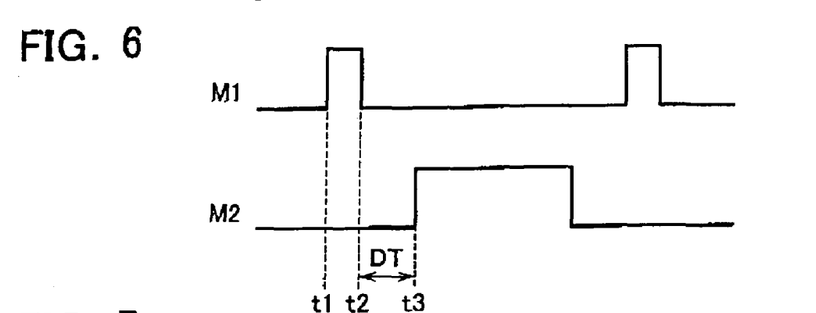
FIG. 6 is a timing diagram showing some major signals as input to a power MOS chip 5, 7 of FIG. 5.

Next, a basic operation of the DC-DC converter 67 will be set forth using FIG. 5 and FIG. 6. FIG. 6 is a timing chart of some major electrical signals to be input to the power MOS chip 5, 7. Suppose that an input voltage Vin is set at 24V, for example. In this case, the input voltage is converted by this converter 67 into a DC voltage of 1.5V, which is then supplied to the CPU 75.

Firstly, at a time point t1, drive a MOSFET (M1) of the power MOS chip 5 to turn on in the state that a MOSFET (M2) of power MOS chip 7 turns off. Whereby, a current indicated by arrow (1) rushes to flow upon application of the input voltage Vin, resulting in electrical power being supplied via the inductor 71 to the CPU 75. Next at time point t2, let the MOSFET (M1) turn off. Whereby, the power supply to CPU 75 due to the input voltage Vin is interrupted. Alternatively, the power being stored in the Inductor 71 permits commutation of a current indicated by arrow (2) through the SBD 69, causing power to be supplied to CPU 75.

After the elapse of a prespecified length of dead time DT that is set for preventing a "shoot-through" current from flowing in the MOSFET (M1) and MOSFET (M2), drive the MOSFET (M2) to turn on at time point t3. As MOSFET (M2) is less in resistance than SBD 69, the current that is produced by the power being stored in inductor 71 behaves to flow not through SBD 69 but through MOSFET (M2), as indicated by arrow (3) in FIG. 5. Thus, power is supplied to CPU 75. The capacitor 73 is used to smoothen the waveform of an output voltage. The illustrative circuitry functions as the DC-DC converter even in the absence of the power MOS chip 7—that is, MOSFET (M2). Accordingly, any circuit configurations with a single power MOS chip rather than multiple chips are also involved in the scope of the invention.

Here the reason why the MOSFET (M2) is provided will be discussed below. At time point t2, the current indicated by arrow (2) flows via the SBD 69. The flow of this current in SBD 69 causes a corresponding degree of voltage drop to take place. This would result in creation of a corresponding degree of loss of the power being supplied to CPU 75. The MOSFET is capable of making the voltage drop smaller than that of SBD. In view of this, a technique is employed for causing the current to flow through SBD 69 within the dead time DT and for forcing, after the elapse of such dead time DT, the current to flow via the MOSFET (M2), thereby achieving efficient power supply to CPU 75.

Next, some major effects and advantages of the first embodiment will be explained. According to the first embodiment, it is possible to lessen the area of a parts mounting space of a semiconductor device (e.g. the DC-DC converter 67) including the semiconductor module 1 while simultaneously reducing the wiring-line impedance and improving the heat releasability thereof, as will be explained in detail below.

Prior known DC-DC converters are such that electronics components including, but not limited to, a power MOS chip, driver IC chip and Schottky barrier diode (SBD) are packaged in a way independent of one another, and these packaged parts are attached to a printed wiring board. In recent years, as the quest for lower voltages and larger currents of PCs or the like are advancing rapidly, the DC-DC converters with such a structure suffer from problems which follows: an increase in parts-mount space, an increase in wiring impedance, and difficulty of heat radiation.

First, the increase in parts-mount space will be explained below. A current capacity required for presently available DC-DC converters might sometimes go beyond the rated current of a MOSFST per se (single power MOS chip). In such a case, the required current capacity is achieved by letting a plurality of power MOS chips be connected in parallel together. Accordingly, in order to support the large-current handleability, it is a must to increase the number of power MOS chips. This results in a likewise increase in parts-mount space which in turn pauses a problem as to the incapability to shrink or downsize the DC-DC converters.

An explanation will next be given of the increase in wiring impedance. When a package substrate much increases in area with an increase in parts-mount space, this inevitably results in an increase in wiring length. This leads to increases in electrical resistance and inductance. An increase in resistance causes unwanted voltage drop-down, which results in shortage of a voltage to be supplied to a load. This becomes the cause of occurrence of operation failures or malfunctions. Alternatively, an increase in inductance serves as a bar to achievement of high-speed performance and proper operability at higher frequencies. Additionally the inductance increase also results in an increase in ringing. Thus, this also causes operation errors.

Lastly, the heat radiation difficulty problem will be discussed. The load such as a CPU is inherently large in heat release/dissipation amount. Thus, the load is required to attach thereto a large size of heat sink. Accordingly, it is difficult to retain the space for attachment of the heat sink of a power MOB chip at a location near the load. In case any heat sink is not attached to the power MOB chip, an approach to avoiding excessive power loss of the power MOB chip is to increase the number of power MOB chips to thereby reduce the MOSFET resistance. However, this does not come without accompanying the risk of an increase in number of power MOB chips. This results in occurrence of a problem as to increases in parts-mount space and in wiring impedance.

According to the semiconductor module 1 in accordance with the first embodiment, the power MOB chips 5 and 7 and the driver IC chip 9 are accommodated together in a single package that is, these chips are built in the same housing envelop. Owing to this, it is possible to reduce the area (achieve miniaturization) of the parts-mount space of the AC-DC converter 67.

In addition, the miniaturization results in an improvement in parts-mount density, which in turn makes it possible to shorten wiring lines between circuit elements. Thus it is possible to reduce the wiring impedance of DC-DC converter 67. Hence, the DC-DC converter 67 is capable of offering enhanced high-speed performance and proper operability at high frequencies.

Furthermore, the presence of the heat sink 53, 55 enables effective radiation and dissipation of the heat that is generated from the power MOB chip 5, 7. In particular, since the other surface 65 of heat sink 53, 55 is exposed to the outside of the semiconductor module 1, it is possible to further improve the heat releasability. Also importantly, the first embodiment is specifically arranged so that the power MOS chip 5, 7 is on-board mounted by flip chip bonding techniques while letting the heat sinks 53 and 55 be laid out on the back surfaces of power MOS chip 5 and 7, respectively. With this structure, it is possible to dispose the heat sink 53, 55 without having to increase the parts-mount area. Simultaneously, even when the power MOS chip 5, 7 is disposed in close proximity to the CPU, this hardly acts as obstruction upon attachment of a heat sink to the CPU. Moreover, the heat sink 53, 55 is attached to the power MOS chip 5, 7 by using conductive paste material 57. As the conductive paste material 57 is excellent in thermal conductivity, the heat created at the chip 5, 7 rapidly transfers to heat sink 53, 55 through the conductive paste material 57. From this point also, it is possible to radiate the heat efficiently.

It should be noted that no heat sink is attached to the driver IC chip 9. In other words, driver IC chip 9 is not covered with a heat sink unlike the power MOS chip 5, 7. However, in order to efficiently dissipate the heat generated from driver IC chip 9, a heat sink may be disposed on the driver IC chip 9.

An additional effect of the first embodiment is as follows. The heat sink 53, 55 also functions as an electrical wiring line for interconnection between the drain electrode 43 of power MOS chip 5, 7 and its corresponding terminal 27 of the package substrate 3. The heat sink 53, 55 is large in area so that it becomes a wiring line which is less in parasitic resistance and parasitic inductance.

Figure 7:
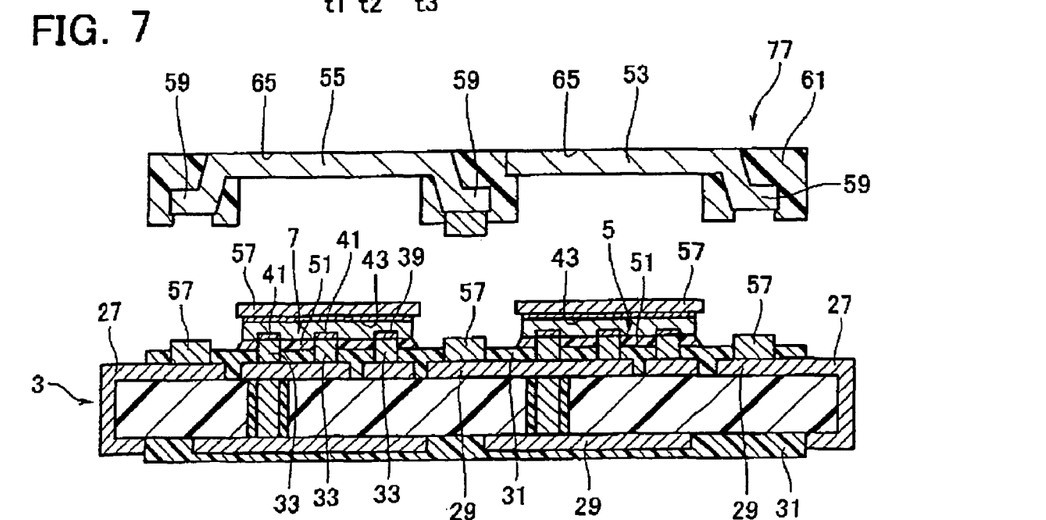
FIG. 7 is a diagram showing the structure of FIG. 3 in a disassembled form.

An explanation will next be given of a method for assembling the semiconductor module 1 with reference to FIG. 7 below. FIG. 7 is a diagram showing the structure of FIG. 3 in a disassembled form. A package substrate 3 is prepared, on which conductive paste material 33 is formed by screen-print techniques. Power MOS chips 5 and 7 are mounted on the package substrate 3 while letting the top surface 45 (FIG. 4) of a respective chip face the package substrate 3, thereby causing gate electrode 39 and source electrode 41 to come into contact with conductive paste material 33. Although not specifically depicted herein, driver IC chip 9 is mounted in such a manner that this also faces the package substrate 3, causing the electrode 49 (FIG. 2) of chip 9 to be in contact with conductive paste material 33. Then, apply reflowing to the conductive paste material 33, thereby letting the gate electrode 39 and source electrode 41 of power MOS chip 5, 7 and also the electrode 49 of driver IC chip 9 be connected by soldering to wiring lines 29 of the package substrate 3.

Next, a dispenser is used to supply an under-fill material 51 to a gap space between the chip 5, 7, 9 and the package substrate 3. Thereafter perform thermal processing to harden the underfill material 51. Note here that the above-noted gap space can be filled with a resin material as will be used during resin sealing to be done at a later step. If the use of this method causes no problems concerning the required characteristics and reliability then the underfill material may not be used.

Next, supply conductive paste material 57 by a dispenser onto the drain electrode 43 of power MOS chip 5, 7 and also to a specified position of the package substrate 3 to be connected to the drain electrode 43. Then, mount a preformed cap 77 on the package substrate 3 in such a manner as to cover the chips 5, 7 and 9. This cap 77 is generally made up of heat sinks 53 and 55 and a resin member 61.

Thereafter, perform reflow processing to thereby seal the chip 5, 7, 9 by the resin member 61. Additionally, due to this reflow, the heat sinks 53 and 55 are rigidly secured and electrically connected to the back surfaces of power MOS chip 5 and 7 respectively. Simultaneously, a fold/bend portion 59 of heat sink 53, 55 is fixed and electrically coupled to a wiring line 29 of the package substrate 3.

Note that the process after having supplied the conductive paste material 57 by the dispenser may be a process which follows. Mount the heat sink 53, 55 on conductive paste material 57. Then, execute reflowing to thereby fix and electrically connect the heat sinks 53 and 55 to the back surfaces of power MOS chips 5 and 7 respectively while at the same time letting the fold portion 59 of heat sink 53, 55 be fixed and electrically coupled to the wiring line 29 of package substrate 3. Lastly, perform sealing by resin member 61 so that the uppermost surface of heat sink 53, 55 is exposed to the outside. Optionally, in case outer leads or "take-out" terminals of the semiconductor module 1 are taken out of the back face of the package substrate 3 as in ball grid array (BGA) packaging architectures, the top surface of mount substrate 3 may be entirely sealed by the resin material.

Second Embodiment

Figure 8:
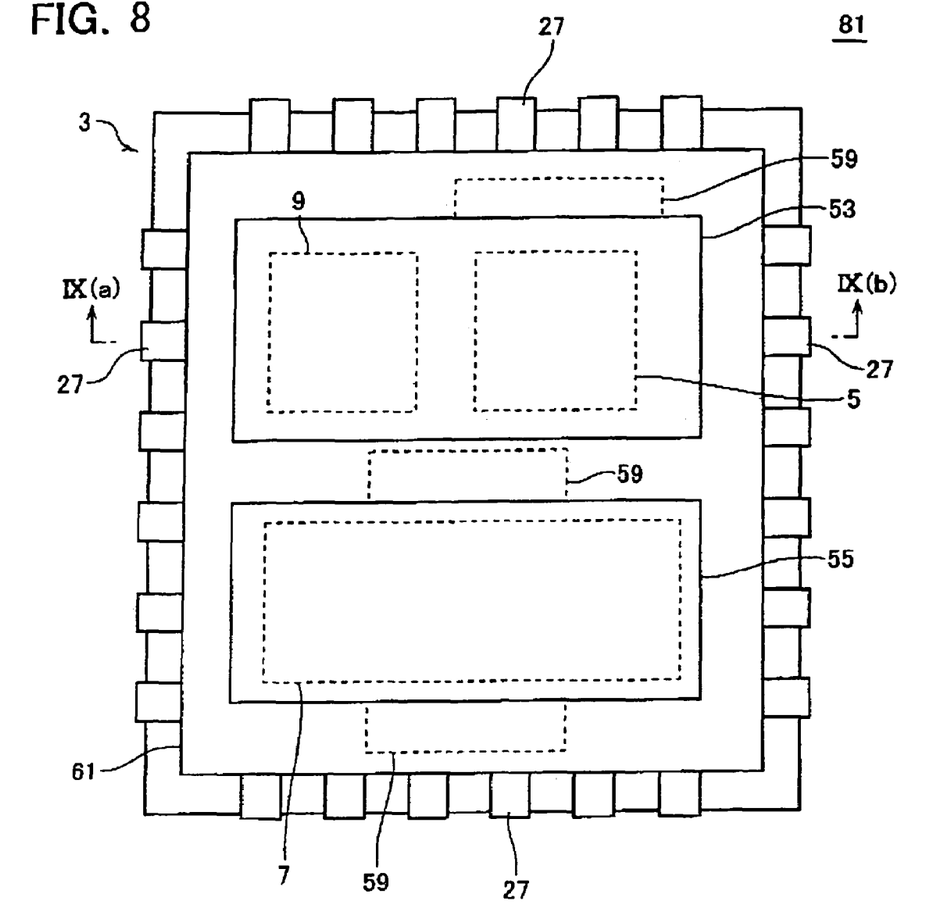
FIG. 8 is a diagram showing a plan view of a semiconductor module in accordance with a second embodiment.
Figure 9:
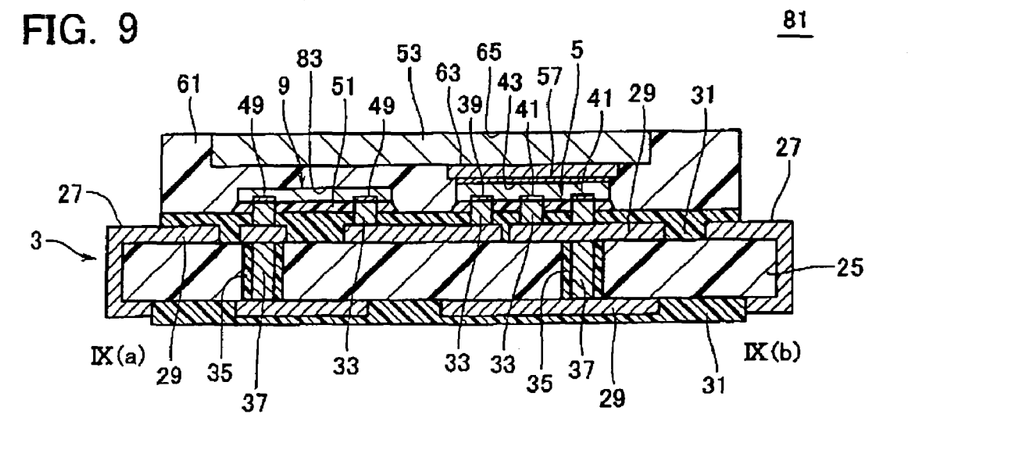
FIG. 9 is a sectional diagram taken along line IX(a)-IX(b) of FIG. 8.

FIG. 8 is a diagram showing a plan view of a semiconductor module 81 in accordance with a second embodiment of the invention. FIG. 9 is a cross-sectional diagram of the module of FIG. 8 as taken along line IX(a)-IX(b). The second embodiment will be set forth with reference to FIGS. 8-9 while focusing an explanation on its differences from the first embodiment.

In the second embodiment, the heat sink 53 that covers the power MOS chip 5 extends to overlie the driver IC chip 9, thereby covering the driver IC chip 9. This permits the power MOS chip 5 and the driver IC chip 9 to commonly use or "share" the heat sink 53. Accordingly, the heat sink is allowed to have a larger area when compared to the case where a separate heat sink covering the driver IC chip 9 is laid out in addition to the heat sink 53. This makes it possible to improve the heat releasability by a degree corresponding thereto.

Note however that the back face 83 of driver IC chip 9 stays at ground potential and is different in potential from the drain region of power MOS chip 5. Thus, the heat sink 53 is electrically isolated or insulated by resin member 61 from driver IC chip 9. This may be reworded so that heat sink 53 extends to overlie the driver IC chip 9 while being insulated from driver IC chip 9.

An adverse structure is also possible—that is, a structure designed so that the heat sink 53 is connected by conductive paste material to the back face 83 of driver IC chip 9 with electrical isolation established by resin member 61 between the heat sink 53 and power MOS chip 5. Using the conductive paste material rather than resin material facilitates heat conduction toward the heat sink 53. Power MOS chip 5 is greater in heat amount than driver IC chip 9. Due to this the second embodiment is arranged so that power MOS chip 5 is connected by conductive paste material 57 to heat sink 53.

With the above-noted connection scheme, the heat sink 53's potential level becomes equal to the drain potential of power MOS chip 5. Hence, driver IC chip 9 is expected to be shielded by the heat sink 53 with its potential fixed to a prespecified level. The back face 83 of driver IC chip 9 is at ground potential. When the DC-DC converter is designed to offer proper operability at higher frequencies, the ground potential can vary due to high-frequency waves, resulting in risks of operation failures of the driver IC chip 9. In the second embodiment, the driver IC chip 9 is shielded by the potential-fixed heat sink 53. Thus it becomes possible to prevent potential variations or fluctuations otherwise occurring due to such high-frequency waves.

In order to provide electrical isolation between the heat sink 53 and the driver IC chip 9, it is a must to set the thickness of resin member 61 interposed therebetween at a specified value—for example, at 10 μm (additionally, the thickness of conductive paste material 57 overlying the power MOS chip 5 is much less than the above-noted specified value). Hence, if the thickness of driver IC chip 9 is the same as that of power MOS chip 5, then the resultant structure is such that heat sink 53 becomes protuberant above the driver IC chip 9. To avoid this, in the second embodiment, the driver IC chip 9 is thinly polished or buffed, causing the thickness of driver IC chip 9 (e.g. 140 μm) to be less than the thickness (e.g. 150 μm) of power MOS chip 5. Whereby, the heat sink 53 is flattened (to have an almost flat surface) to thereby achieve the planarized semiconductor module 81.

Third Embodiment

Figure 10:
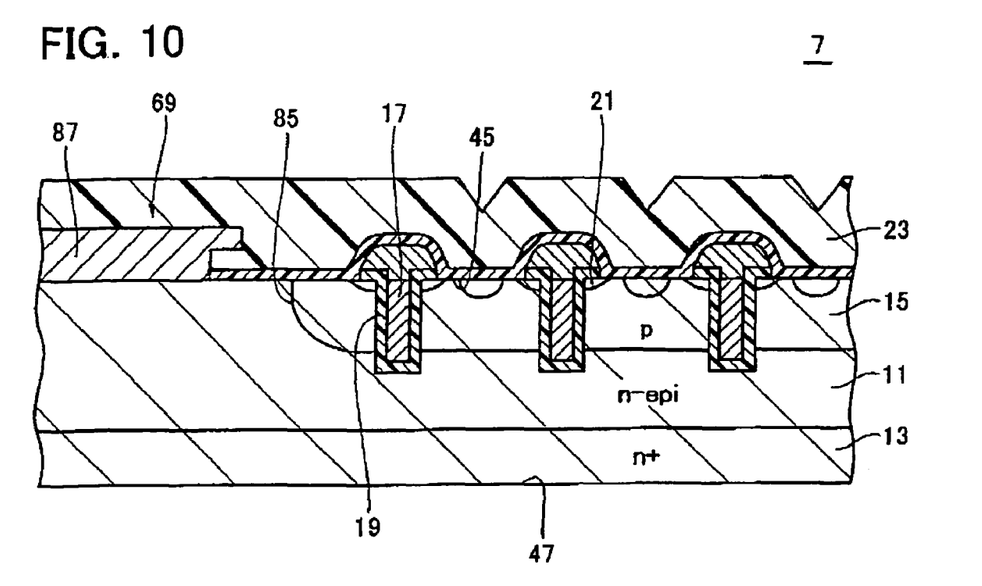
FIG. 10 is a sectional diagram of part of a power MOS chip (synchronous rectification-side element) as used in a third embodiment.

A third embodiment is different from the embodiments stated above in that the former is equipped with a power MOS chip (synchronous rectification-side element) 7 with a built-in SBD 69. FIG. 10 illustrates, in cross-section, part of the power MOS chip (synchronous rectification-aide element) 7 equipped in the third embodiment, which corresponds to FIG. 4. The SBD 69 in formed so that it is spaced apart by a specified distance from a terminate end 85 of a MOSFET fabrication region. This specified distance to a distance which avoids any appreciable interference between the MOSFET and SBD.

The SBD 69 is configured from an epitaxial layer 11 and a metallic film 87 made of aluminum or the like, which is formed thereon. The epitaxial layer 11 and metal film 87 are contacted together, resulting in formation of a Schottky barrier at such contact portion. SBD 69 is connected in parallel to the MOSFET of power MOS chip 7. The SBD 69 may be replaced with a pn-junction diode when the need arises.

With use of the power MOS chip 7 having its built-in SED 69 for the semiconductor module as in the third embodiment, it is possible to reduce the number of constituent parts when compared to the case of using a discrete chip of SBD 69. Owing to this, it becomes possible to shorten an assembly time of the semiconductor module while at the same time enabling shrink or miniaturization of the semiconductor module. In addition, any wiring lines for connection between the power MOS chip 7 and SBD 69 are no longer required. Thus it is possible to eliminate the impedance of such wiring lines, which in turn makes it possible to obtain the intended semiconductor module excellent in high-speed performance.

Fourth Embodiment

Figure 11:
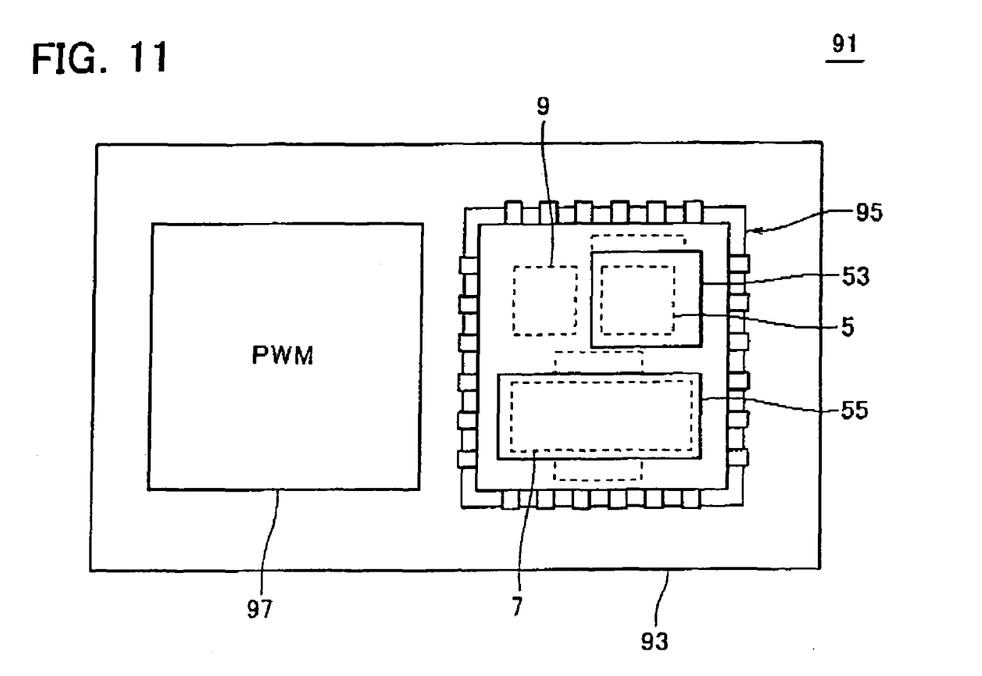
FIG. 11 is a plan view of a semiconductor device in accordance with a fourth embodiment.

FIG. 11 is a plan view of a semiconductor device 91 in accordance with a fourth embodiment. The semiconductor device 91 has a printed wiring board 93, a semiconductor module 95 mounted thereon, and an IC chip 97 for PWM control use. A difference of this semiconductor module 95 from the semiconductor module 1 shown in FIG. 1 is as follows. While a PWM control circuit is built in the driver IC chip 9 of semiconductor module 1, the driver IC chip 9 of the semiconductor module 95 lacks such built-in PWM control circuit. In view of this, the fourth embodiment is arranged so that the PWM control-use IC chip 97 is provided separately from the driver IC chip 9.

A scheme for driving the gate of MOSFET of power MOB chip 5, 7 by the driver IC chip 9 employs a PWM control technique. An important part for attaining enhanced high speed performances must be a drive circuit which provides direct coupling with gate terminals of MOSFETs of power MOS chips 5 and 7 and which controls charge-up/discharge of electrical carriers at the gates. For this reason, it is required that the MOSFET gate terminal of power MOB chip 5, 7 and the drive circuit of driver IC chip 9 be connected together while setting the impedance at the lowest possible level. To this end, the power MOS chip 5, 7 and driver IC chip 9 are built together into semiconductor module 95. On the other hand, the PWM control circuit per se is relatively less in influenceability of wiring-line impedance. In addition, the PWM control circuit is larger in area than the driver circuit. In the fourth embodiment, the PWM control IC chip 97 is provided separately. Thus it is possible to downsize the driver IC chip 9. This makes it possible to improve the layout flexibility or "degree of freedom" of the driver IC chip 9.

Fifth Embodiment

Figure 12:
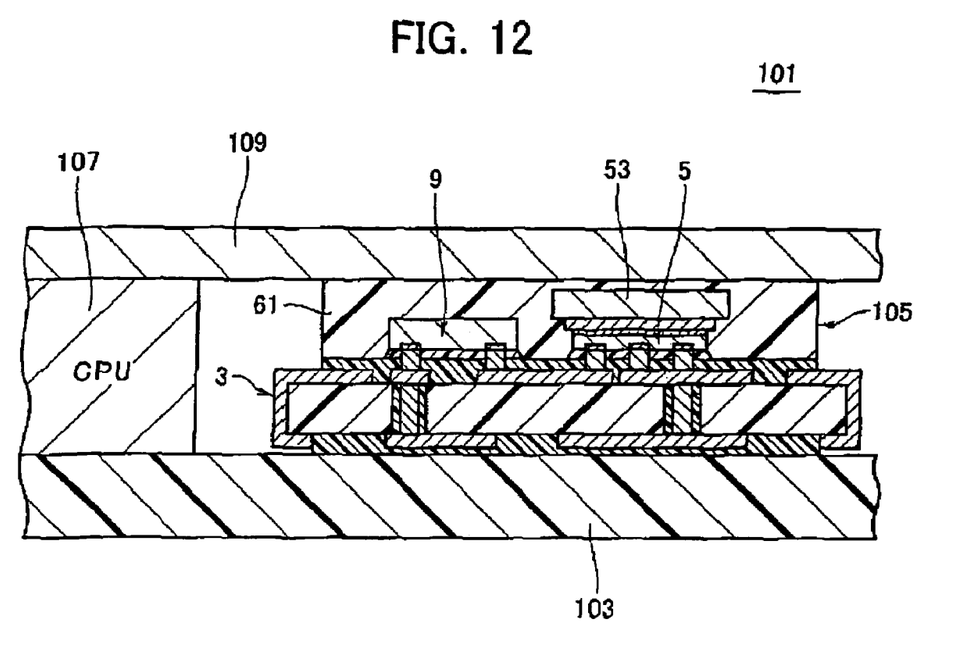
FIG. 12 is a sectional diagram of part of a semiconductor device in accordance with a fifth embodiment.

FIG. 12 depicts a cross-sectional view of part of a semiconductor device 101 in accordance with a fifth embodiment. The semiconductor device 101 is structured so that a semiconductor module 105 and CPU 107 are mounted together on a printed wiring board 103. Electrical power is supplied to CPU 107 by a DC-DC converter, which includes therein the semiconductor module 101.

A difference of the semiconductor module 105 from the semiconductor module 1 of FIG. 2 lies in that the heat sink 53, 55 (heat sink 55 is not visible in FIG. 12) of semiconductor module 1 is entirely covered with the resin member 61. In other words, the heat sink does not have any externally exposed portions.

A heat sink 109 is laid out on the CPU 107. This heat sink 109 is designed to extend to reach a location covering the semiconductor module 105. This design is aimed at enlargement of the area of heat sink 109. The heat sink of semiconductor module 105 is entirely covered with resin member 61. Thus it is possible to prevent electrical shorting with the outside via the heat sink 109.

As apparent from the foregoing, it is possible for this embodiment to realize the intended semiconductor module capable of achieving small area of parts-mounting space and reducing the wiring impedance and also improving heat releasability.

The invention claimed is:

1. A semiconductor module, comprising:
   a package substrate;
   a first power switching device chip having electrodes on a top surface and on a back surface, configured to flow current between said electrodes, and being mounted above said package substrate while letting said top surface face said package substrate;
   a second power switching device chip having electrodes on a top surface and on a back surface, configured to flow current between said electrodes, and being mounted above said package substrate while letting said top surface face said package substrate;
   an integrated circuit ("IC") chip mounted above said package substrate, configured to drive gates of transistors formed in said first and second power switching device chips;
   a first heat sink disposed above said electrode on said back surface of said first power switching device chip,
   a second heat sink disposed above said electrode on said back surface of said second power switching device chip, and
   a resin member configured to seal said first and second power switching device chips and said IC chip as a single package,
   wherein said electrode on said back surface of said first power switching device chip is electrically connected to said electrode on said top surfaces of said second power switching device chip via said first heat sink.

2. A semiconductor module, comprising:
   a package substrate;
   a first power switching device chip having electrodes on a top surface and on a back surface, configured to flow current between said electrodes, and being mounted above said package substrate while letting said top surface face said package substrate;
   a second power switching device chip having electrodes on a top surface and on a back surface, configured to flow current between said electrodes, and being mounted above said package substrate while letting said top surface face said package substrate;
   an integrated circuit ("IC") chip mounted above said package substrate, configured to drive gates of transistors formed in said first and second power switching device chips;
   a first heat sink disposed above said electrode on said back surface of said first power switching device chip,
   a second heat sink disposed above said electrode on said back surface of said second power switching device chip, and
   a resin member configured to seal said first and second power switching device chips and said IC chip as a single package,
   wherein said electrode on said back surface of said first power switching device chip is electrically connected to said electrode on said top surfaces of said second power switching device chip via said first heat sink, and
   wherein said heat sinks have respective terminals electrically connected to respective electrodes on said package substrate and are electrically connected respectively to said back surfaces of said power switching device chips, and at least one of said heat sinks have two terminals fixed on said package substrate at two portions.

3. The semiconductor module according to claim 2, wherein said package substrate comprises a plurality of outer input/output terminals, and wherein said first and second heat sinks are electrically connected to said corresponding outer input/output terminals, respectively.

4. The semiconductor module according to claim 2, wherein said second heat sink is insulated from said IC chip and extends to overlie said IC chip.

5. The semiconductor module according to claim 4, wherein a gate electrode and a source electrode are formed on top surfaces of said first and second power switching device chips, and wherein a drain electrode is formed on a back surface of said first and second power switching device chips.

6. The semiconductor module according to claim 4, further comprising:
   a built-in diode parallel-connected to said transistor formed in said first power switching device.

7. The semiconductor module according to claim 4, wherein said first and second power switching device chips and said IC chip are mounted above said package substrate by flip-chip bonding.

8. The semiconductor module according to claim 2, wherein said plurality of heat sink members have respective terminals electrically connected to electrodes on said package substrate and are electrically connected to said back surfaces of said plurality of power switching device chips, and wherein said terminals are aligned in line.

9. The semiconductor module according to claim 2, wherein at least one of said plurality of power switching device chips is shaped rectangular,
   wherein a heat sink corresponding to said rectangular chip has terminals electrically connected to electrodes on said package substrate and is electrically connected to said back surface of said rectangular chip, and
   wherein said rectangular chip has two opposite longer sides on which said terminals are arranged.

* * * * *